United States Patent

Yakshin et al.

[11] 4,030,339
[45] June 21, 1977

[54] IMPACT IMPULSE MEASURING DEVICE

[76] Inventors: Alexandr Sergeevich Yakshin, ulitsa Malaya Filevskaya, 66, kv. 104; Oleg Nikolaevich Novikov, ulitsa Kuznetsky most, 18/7, kv. 6; Dmitry Alexeevich Grechinsky, ulitsa Tolbukhina, 8, korpus 2, kv. 48; Viktor Alexandrovich Klochko, ulitsa Oktyabrskaya, 38, kv. 374; Viktor Georgievich Rygalin, 3-Dorozhny proezd, 5, korpus 2, kv. 103, all of Moscow, U.S.S.R.

[22] Filed: Feb. 17, 1976

[21] Appl. No.: 658,687

[30] Foreign Application Priority Data

Feb. 28, 1975 U.S.S.R. .......................... 2109015

[52] U.S. Cl. .................................................. 73/12
[51] Int. Cl.² ............................................ G01N 3/30
[58] Field of Search ............... 73/12, 84, 88 E, 11

[56] References Cited

UNITED STATES PATENTS 3,712,122  1/1973  Harris et al. .................. 73/12 X
3,838,428  9/1974  Benson et al. .................. 73/84 X

*Primary Examiner*—Jerry W. Myracle
*Attorney, Agent, or Firm*—Lackenbach, Lilling & Siegel

[57] ABSTRACT

An impact impulse measuring device comprises an acceleration transducer which converts the mechanical oscillations of the object being tested into electric signals which are applied to an amplifier unit which is electrically coupled to a means for measuring the parameters of an impact impulse via a means for automatically switching the range of measuring impact impulse parameters. The means for measuring parameters of an impact impulse includes a comparator connected to one of the inputs of a digital-analog converter and a reference voltage source connected to another input of the digital-analog converter, the digital-analog converter having its third input connected to a high-frequency pulse generator. A first input of the means for automatically switching the range of measuring parameters of an impact impulse is connected to an output of the amplifier unit, a second input is connected to an output of the high-frequency pulse generator, a third input is connected to an output of the reference voltage source, a first output is connected to the comparator, and its second output is connected to a reset bus of the digital-analog converter.

8 Claims, 4 Drawing Figures

IMPACT IMPULSE MEASURING DEVICE

The present invention relates to devices for measuring impact overload parameters and, more particularly, to devices for measuring impact impulses and devices for measuring peak acceleration values of an impact impulse with an automatic selection of the range of measurements, depending upon the peak acceleration magnitude of the impact impulse being measured.

There is known an impact impulse measuring device, wherein an acceleration transducer converts the mechanical oscillations of the object being measured into electric signals which are applied via an amplifier unit to a means for measuring parameters of an impact impulse. The device measures the peak value of the impact impulse. In this device, the switching over to a required measurement range is done manually with the aid of a switch, which considerably reduces the rate of measuring the acceleration of an impact impulse.

It is an object of the present invention to provide an impact impulse measuring device which would make it possible to automatically select a required measurement range and thus increase the operating speed of the impact impulse measuring device.

The foregoing object is attained by providing a device for measuring impact impulses, in which an acceleration transducer converts the mechanical oscillations of the object being tested into electric signals which are applied to an amplifier unit electrically coupled to a means for measuring parameters of an impact impulse, said means including a comparator connected to one of the inputs of a digital-analog converter, a reference voltage source connected to another input of the digital-analog converter, and a high-frequency pulse generator connected to a third input of said convertor, said device being provided, according to the invention, with a means for automatically switching the range of measuring parameters of an impact impulse, its first input being connected to an output of the amplifier unit, its second input being connected to an output of the high-frequency pulse generator, its third input being connected to an output of the reference voltage source, its first output being connected to the comparator, and its second output is connected to a reset bus of the digital-analog converter.

It is advisable that the means for automatically switching the range of measuring parameters of an impact impulse should include three amplifiers having different gain factors, their inputs being the first input of the means for automatically switching the range of measuring parameters of an impact impulse, said amplifiers being provided with individual switches connected to their outputs, an operational amplifier whose input is connected to the outputs of the switches, its output being a first output of the means for automatically switching the range of measuring parameters of an impact impulse and being connected to the input of the comparator, and components interconnected in series, including a zero-crossing detector whose first input is connected to said output of the operational amplifier, its second input, which is the third input of the means for automatically switching the measurement range, being connected to the output of the reference voltage source, a pulse former and a first AND element whose second input, which is the second input of the means for automatically switching the measurement range, is connected to the output of the high-frequency pulse generator; it is also advisable that the means for automatically switching the measurement range should further include a one-shot multivibrator whose input is connected to the output of the first AND element, its output, which is the second output of the means for automatically switching the measurement range, being connected to the reset bus of the digital-analog converter, a second AND element whose inputs are connected to the output of the first AND element and to said output of the one-shot multivibrator, and a binary counter built around two interconnected flip-flops, the first being connected to the output of the second AND element, the second being connected through one of its outputs to a switch connected to the amplifier having a minimum gain factor; it is still further advisable that the means for automatically switching the measurement range should include a first NOT AND element and a second NOT AND element connected to the outputs of the first and second flip-flops, the first NOT AND element being connected to a switch connected to the amplifier having a maximum gain factor, the second NOT AND element being connected to the switch connected to the amplifier whose gain factor is between the maximum and minimum gain factors, The foregoing structure of the device provides for measurement of a peak acceleration value of an impact impulse while automatically selecting the range of measurements, and raises the operating speed of the device.

Other objects and advantages of the present invention will become more apparent from the following detailed description of a preferred embodiment thereof taken in conjunction with the accompanying drawings, wherein.

The impact impulse measuring device of the present invention will be described below with reference to measuring one of the parameters of an impact impulse, namely, the peak acceleration value of an impact impulse being measured.

Figure 1:
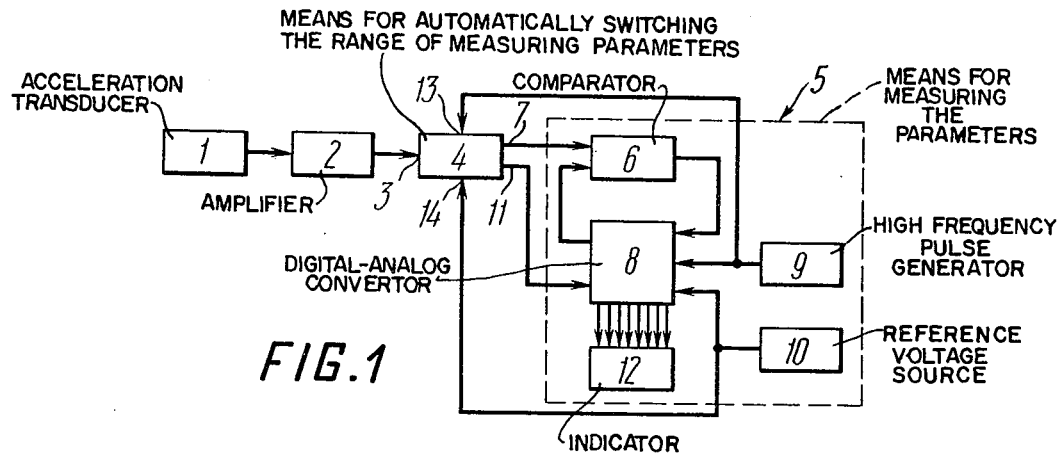
FIG. 1 is a block diagram of an impact impulse measuring device in accordance with the invention.

Referring now to the attached drawings, the proposed device for measuring impact impulses comprises, according to the invention and as shown in FIG. 1, an acceleration transducer 1 for coverting the mechanical oscillations of the object being tested into electric signals. This type of transducer is well known in literature (cf. V. S. Pellinetz, "Izmereniye udarnykh uskoreniy"/-"Impact Acceleration Measurements"/, published by Izdatelstvo Standartov, Moscow, 1975, pp 184–190). Said transducer 1 is connected via an amplifier unit 2 (ibid., pp. 191-204) to a first input 3 of a means 4 for automatically switching the range of measuring parameters of an impact impulse. The means 4 for automatically switching the range of measuring parameters of an impact impulse is connected to a means 5 for measuring the parameters of an impact impulse.

The means 5 for measuring parameters of an impact impulse comprises a comparator 6 to whose first input there is connected a first output 7 of the means 4 for automatically switching the range of measuring parameters of an impact impulse; connected to a second input of said comparator 6 is an output of a digital-analog converter 8 to whose first, second and third inputs there are connected an output of the comparator 6, a high-frequency pulse generator 9 and a reference voltage source 10, respectively. Connected to its reset bus is a second output 11 of the means 4 for automatically switching the range of measuring parameters of an impact impulse. Counting outputs of the digital-analog converter 8 are connected to an indicator 12 which indicates the measured value of a given impact impulse parameter.

Said output of the high-frequency pulse generator 9 is connected to a second input 13 of the means 4; said output of the reference voltage 10 is connected to a third input 14 of the means 4.

The means 4 (FIG. 2) for automatically switching the range of measuring parameters of an impact impulse, in turn, includes a first amplifier 15, a second amplifier 16, and a third amplifier 17 whose inputs are interconnected and are connected via the input 3 to the output of the amplifier unit 2.

The amplifiers 15, 16 and 17 have different gain factors: the amplifier 15 has a minimum gain factor, the amplifier 17 has a maximum gain factor, and the gain factor of the amplifier 16 is between those of the amplifiers 15 and 17.

Outputs of the amplifiers 15, 16 and 17 are connected to first inputs of individual switches 18, 19 and 20, respectively. Outputs of the switches 18, 19 and 20 are interconnected and connected to an input of an operational amplifier 21 whose output is the first output 7 of the means 4 fo automatically switching the range of measuring parameters of an impact impulse and which is connected to the input of the comparator 6 (FIG. 1).

Figure 2:
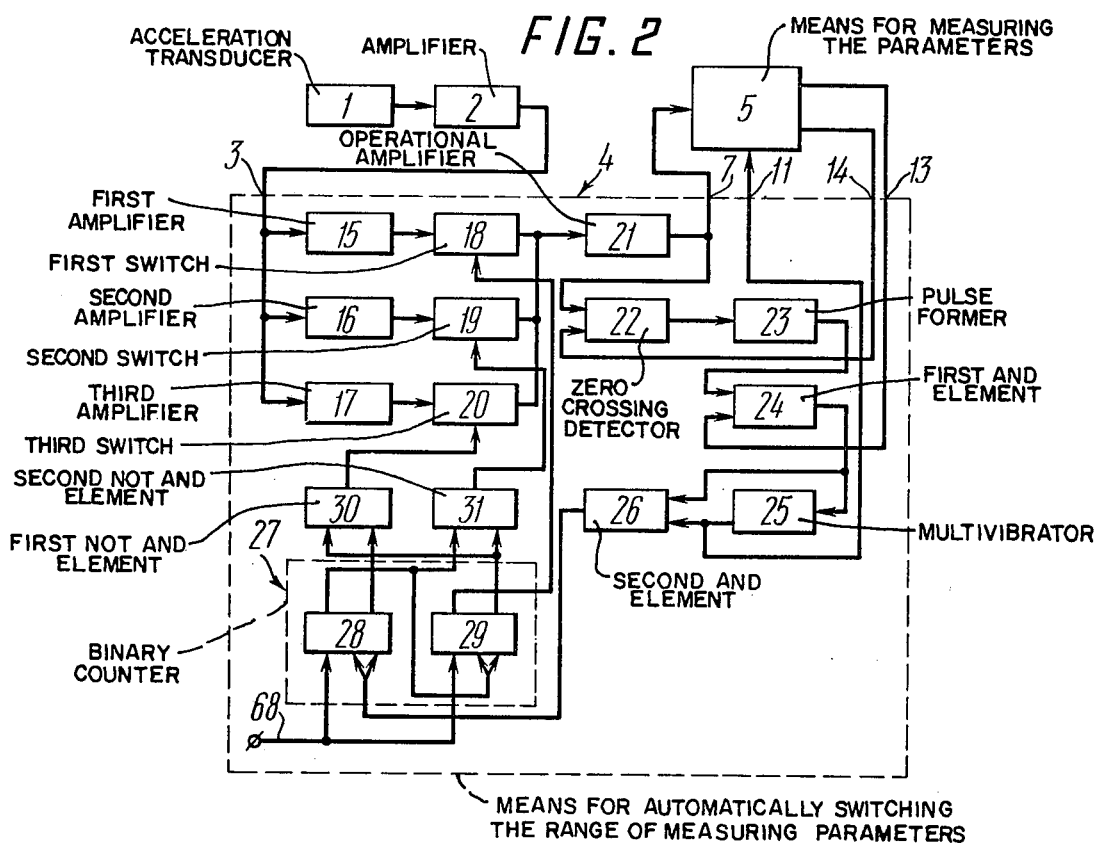
FIG. 2 is a block diagram of a means for automatically switching the range of measuring parameters of an impact impulse, in accordance with the invention.

In addition, the means 4 for automatically switching the range of measuring parameters of an impact impulse includes the following components interconnected in series: a zero-crossing detector 22 (FIG. 2), a pulse former 23, and a first AND element 24. A first input of the zero-crossing detector 22 is connected to the output of the operational amplifier 21 and, a its second input, which is the third input 14 of the means 4 for automatically switching the range of measuring parameters of an impact impulse, is connected to the output of the reference voltage source 10 (FIG. 1). A second input of the AND element 24 (FIG. 2), which is the second input 13 of the means 4 for automatically switching the range of measuring parameters of an impact impulse, is connected to the output of the high-frequency pulse generator 9 (FIG. 1). An output of said first AND element 24 is connected to an input of a one-shot multivibrator 25 (FIG. 2) and to a first input of a second AND element 26. An output of the one-shot multivibrator 25, which is the second output 11 of the means 4 for automatically switching the range of measuring parameters of an impact impulse, is connected to the reset bus of the digital-analog converter 8 (FIG. 1) and to a second input of the second AND element 26 (FIG. 2).

The means 4 for automatically switching the range of measuring parameters of an impact impulse also includes a binary counter 27 which includes a first flip-flop 28 and a second flip-flop 19 which are interconnected. The first flip-flop 28 is connected to the output of the second AND element 26. One output of the second flip-flop 29 is connected to the switch 18. The means 4 still further includes a first NOT AND element 30 and a second NOT AND element 31 which are connected to outputs of the flip-flops 28 and 29. An output of the NOT AND element 30 is connected to the switch 20 and an output of the second NOT AND element 31 is connected to the switch 19.

Figure 3:
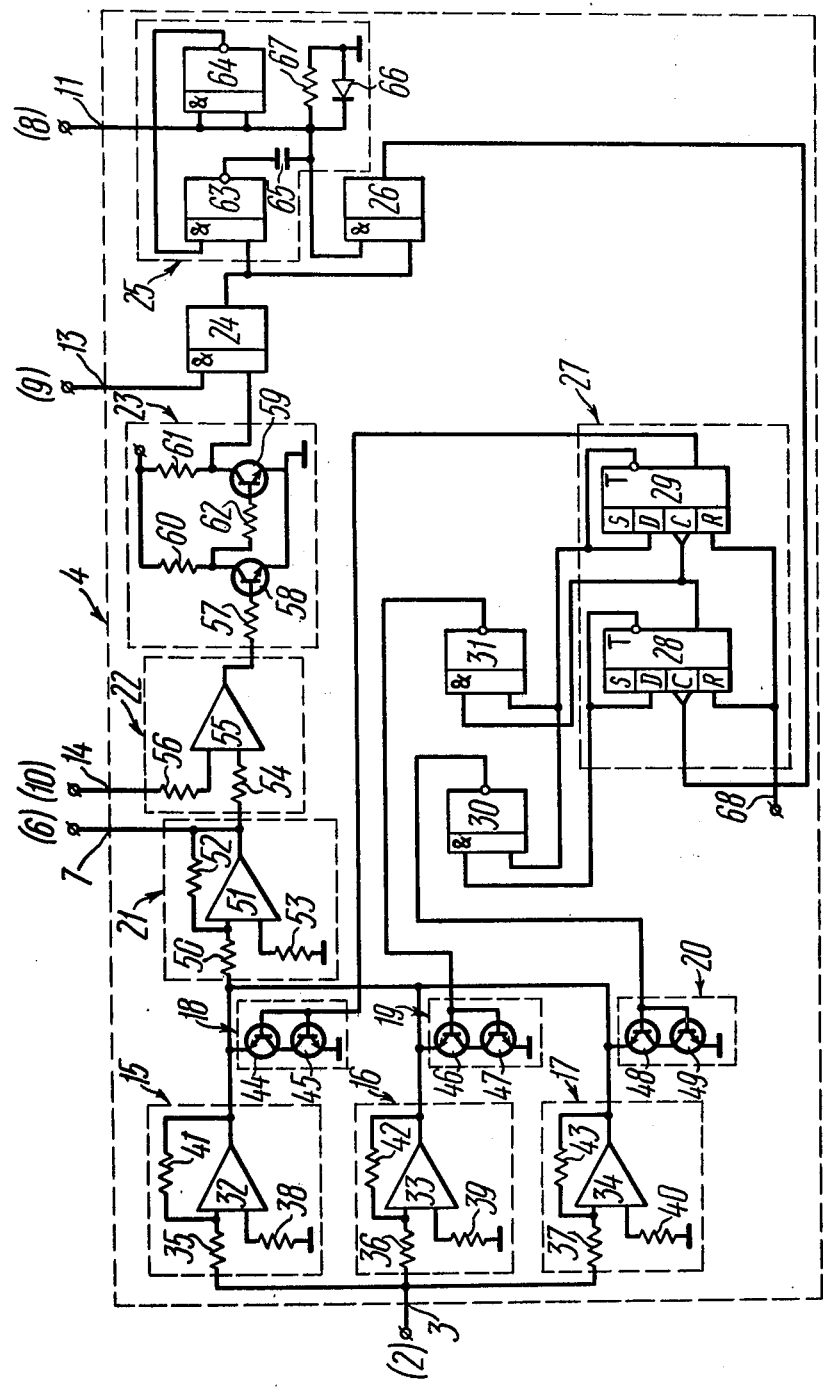
FIG. 3 is a functional diagram of the means for automatically switching the range of measuring parameters of an impact impulse of FIG. 2.

A functional diagram of the means 4 for automatically switching the range of measuring parameters of an impact impulse is presented in FIG. 3. The means 4 comprises the three amplifiers 15, 16 and 17 each of which includes an integrated microcircuits 32, 33 and 34, respectively. In addition, each amplifier comprises one of the resistors 35, 36 or 37, one of the bias resistors 38, 39 or 40, or one of the feedback resistors 41, 42 or 43, respectively. The feedback resistors 41, 42 and 43 are placed between one input and the output of the integrated microcircuits 32, 33 and 34 of the amplifiers 15, 16 and 17, respectively. Connected to the outputs of the microcircuits 32, 33 and 34 are the switches 18, 19 and 20, each of which includes two transistors 44 and 45, 46 and 47 and 48 and 49, respectively, said transistors having common bases and collectors. The emitters of the transistors 44, 46 and 48 are interconnected and are connected to a current-limiting resistor 50 of the operational amplifier 21 which includes an integrated microcircuit 51; the operational amplifier 21 also includes a feedback resistor 52 placed between one input and the output of the integrated microcircuit 51, and a bias resistor 53. The output of the microcircuit 51 of the operational amplifier 21 is connected to the comparator 6.

The output of the microcircuit 51 of the operational amplifier 21 is also connected via a current-limiting resistor 54 to one input of an integrated microcircuit 55 of the zero-crossing detector 22; connected to another input of the microcircuit 55, via a current-limiting resistor 56, is the reference voltage source 10. The output of the microcircuit 55 is connected to an input resistor 57 of the pulse former 23. The pulse former 23 comprises two stages placed in series which include transistors 58 and 59 with load resistors 60 and 61 and input resistors 57 and 62. The collector of the transistor 59 is connected to one of the inputs of the AND element 24 to whose other input there is connected the high-frequency pulse generator 9.

The output of the AND element 24 is connected to the input of the one-shot multivibrator 25 which include two NOT AND elements 63 and 64, a capacitor 65 and a diode 66 shunted by a resistor 67. One of inputs of the NOT AND element 63 is connected to an output of the NOT AND element 64. An output of the NOT AND element 63 is coupled via the capacitor 65 to interconnected inputs of the NOT AND element 64, the diode 66 and the resistor 67. Interconnected inputs of the NOT AND element 64 are connected to the reset bus of the digital-analog converter 8. In addition, the interconnected inputs of the NOT AND element 64 are connected to one input of the AND element 26 to whose other input there is connected the output of the AND element 24. The output of the AND element 26 is connected to the C input of the D flip-flop 28 of the binary counter 27. The inverting output of the D flip-flop 28 is connected to its D input and to one input of the NOT AND element 30. The non-inverting output of the D flip-flop 28 is connected to the C input of the D flip-flop 29 and to one input of the NOT AND element 31. The other inputs of the NOT AND elements 30 and 31 are interconnected and are connected to the D input and to the inverting output of the D flip-flop 29 whose non-inverting output is connected to the bases of the transistors 44 and 45 of the switch 18. The outputs of the NOT AND elements 30 and 31 are connected to the bases of the transistors 48, 49 and 46, 47 of the switches 20 and 19, respectively. The R inputs of the D flip-flops 28 and 29 are interconnected and connected to a reset bus 68.

Figure 4:
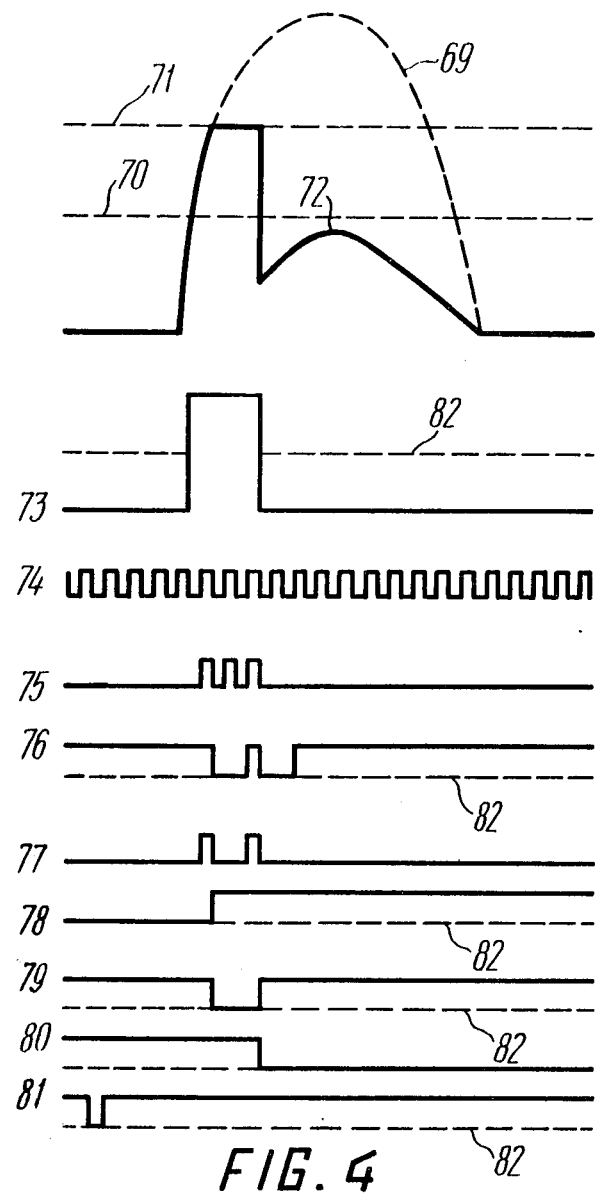
FIG. 4 shows spatial-time plots illustrating operation of the impact impulse measuring device of FIG. 1.

Operation of the proposed device for measuring impact impulses will be better understood from FIG. 4.

FIG. 4 shows an impact impulse 69, a reference voltage level 70, a saturation voltage level 71, voltage 72 across the output of the operational amplifier 21, a potential 73 at the output of the zero-crossing detector 22, pulses 74 supplied by the high-frequency pulse generator 9, pulses 75 at the output of the AND element 24, a potential 76 at the output of the one-slot multivibrator 25, pulses 77 at the output of the AND element 26, a potential 78 at the input of the switch 20, a potential 79 at the input of the switch 19, a potential 80 at the input of the switch 18, a reset pulse 81, and a zero potential level 82.

The proposed impact impulse measuring device operates as follows.

At the start of operation, the reset pulse 81, applied to the bus 68, resets the binary counter 27 (FIG. 3) built around the flip-flops 28 and 29. As this takes place, the voltage across the output of the digital-analog converter 8 (FIG. 1) is zero.

From the output of the acceleration transduces 1 placed on an object being tested (not shown), the electric signal is applied to the amplifier unit 2. A normalized signal is formed at the output of the amplifier unit 2, the shape of said signal being identical with that of the impact impulse 69 (FIG. 4). Said signal 69 is simultaneously applied to the three amplifiers 15, 16 and 17 (FIG. 3) having different gain factors. The resistance values of the feedback resistors 41, 42 and 43 are selected so that the amplifier 15 has a minimum gain factor, the amplifier 17 has a maximum gain factor, and the gain factor of the amplifier 16 is between those of the amplifiers 15 and 17. The signal sent from the output of the NOT AND element 30 closes the switch 20, and the input signal being measured is applied from the output of the amplifier 17, which has the maximum gain factor, to the input of the operational amplifier 21.

If the peak magnitude of the input signal is great, the amplifier 17 and the operational amplifier 21 are saturated, and the voltage 72 across the output of the operational amplifier 21 reaches the saturation level 71. From the output of the operational amplifier 21 and from the reference voltage source 10, signals are applied to the input 2 of the zero-crossing detector 22. The reference voltage level 70 is selected to be equal to the maximum value of voltage at the output of the digital-analog converter 8 of the means 5 for measuring impact impulse parameters.

If the voltage 72 (FIG. 4) across the output of the operational amplifier 21 (FIG. 3) is greater than the reference voltage level 70, the zero-crossing detector is brought into play, and the positive potential 73 is formed at its output. The potential 73 is applied to the two stages connected in series and made up of the transistor 58 and 59 of the pulse former 23. Said stages amplify the signal and form a positive pulse which is applied from the load resistor 61 of the transistor 59 to one of the inputs of the AND element 24. Applied simultaneously to the other input of said AND element 24 are the pulses 74 from the high-frequency generator 9. As a result, the pulses 75 appear at the output of the AND element 24.

The first pulse from the output of the AND element 24 passes through the AND element 26 and is separated at the latter's output. The first pulse 77 is applied to the first input of the flip-flop 28 of the binary counter 27. As this takes place, the potential 78 is formed at the output of the NOT AND element 30, which is applied to the input of the switch 20.

The trailing edge of the first of the pulses 75 actuates the one-shot multivibrator 25 so that zero potential is formed at the latter's output. Operation of the one-shot multivibrator 25 made up of the two NOT AND elements 63 and 64, the capacitor 65 and the diode 66, said diode being shunted by the resistor 67, is widely described in literature (cf. L.M. Goldenberg, "Impulsnye i tsifrovye ustroystva" /"Pulse and Digital Devices"/, Svyaz Pulbishers, Moscow, 1973, p. 310).

From the output of the one-shot multivibrator 25, the pulse 76 is also applied to the input of the AND element 26 and prevents the passage of the pulses 75 from the output of the AND element 24 to the input of the binary counter 27 until the transient processes of the amplifier 21 are over.

Following the passage of the first of the pulses 75 from the output of the AND element 24, the potential 78 is applied to the input of the switch 20 and renders the latter non-conducting; the potential 79, applied to the input of the switch 19 from the output of the NOT AND element 31, drives into conduction said switch 19 which connects the output of the amplifier 16 to the input of the operational amplifier 21. The gain factor of the amplifier 16 is less than that of the amplifier 17.

Due to the fact that the magnitude of the signal at the output of the amplifier unit 2 continues to be great, there appears a second pulse 77 at the output of the AND element 26, which takes place after the one-shot multivibrator 25 has been brought into its initial state. Said pulse is applied to the binary counter 27; as a result, the positive potential is formed at the input of the switch 19, and the zero potential 80 appears at the input of the switch 18.

The switch 19 is rendered non-conducting. The switch 18 is driven into conduction, and the amplifier 15 having the least gain factor is connected to the input of the operational amplifier 21. The voltage 72 at the output of the operational amplifier 21 becomes less than the reference voltage level 70. The zero-crossing detector 22 is brought into action, and the potential 73 at its output is brought down to reach the initial value. Zero potential appears at the output of the AND element 24.

From the output of the operational amplifier 21, the voltage 72 is applied to the comparator 6 (FIG. 1), and its peak value is measured by the means 5 for measuring parameters of an impact impulse. Operation of the means 5 for measuring parameters of an impact impulse is described in U.S. Pat. No. 3,286,253. At the same time, reset pulses are applied from the output of the one-shot multivibrator 25 (FIG. 3), via the reset bus of the digital-analog converter 8, to the digital-analog converter 8, so that the measurement of the peak value of the impact impulse starts following the selection of a required measurement range.

The device of the present invention provides for a faster measurement of a peak magnitude of an impact impulse due to automatic selection of the measurement range. The proposed device makes it possible to dispense with repeated impact action which may be the case when the range of measurements is selected manually and when the peak acceleration value of an impact impulse is not known in advance. The proposed design of the means for automatically selecting the range of measurements also accounts for an increased rate of measurements.

The device of the present invention provides for faster testing of different objects for impact strength and thus reduces the testing costs.

What is claimed is:

1. An impact impulse measuring device comprising:

an acceleration transducer having an output and converting mechanical oscillation of an object being tested into electric signals;

an amplifier unit having an input and an output, said input being connected to said output of said acceleration transducer, said amplifier unit receiving said electric signals arriving from said acceleration transducer;

a means for automatically switching the range of measuring parameters of said impact impulse having first, second and third inputs and first and second outputs, said first input being connected to said output of said amplifier unit;

a means for measuring parameters of said impact impulse having first and second inputs and first and second outputs and including a comparator having first and second inputs and an output, said first input of said comparator, which is the first input of said means for measuring parameters of said impact impulse, being connected to the first output of said means for automatically switching the range of measuring parameters of said impact impulse, said means for measuring parameters of said impact impulse further including a digital-analog converter having a reset bus, which is the second input of said means for measuring parameters of said impact impulse and first, second and third inputs, an output, and a group of counting outputs, said reset bus being connected to the second output of said means for automatically switching the range of measuring parameters of said impact impulse, the first input and said output of said digital-analog converter being connected to said comparator, a high-frequency pulse generator having an output which is the first output of said means for measuring parameters of said impact impulse and is connected to the second input of the digital-analog converter and the second input of said means for automatically switching the range of measuring parameters of said impact impulse, a reference voltage source having an output which is the second output of said means for measuring parameters of said impact impulse and is connected to the third input of said digital-analog converter and the third input of said means for automatically switching the range of measuring parameters of said impact impulse, and an indicator having a group of inputs, said group of inputs being connected to said group of counting outputs of said digital-analog converter, said indicator indicating a measured value of said parameter of said impact impulse.

2. An impact impulse measuring device as claimed in claim 1, wherein said means for automatically switching the range of measuring parameters of said impact impulse comprises:

a first amplifier with an input and an output having a minimum gain factor;

a first switch having first and second inputs and an output, said first input being connected to said output of said first amplifier;

a second amplifier with an input and an output, whose gain factor is greater than that of said first amplifier;

a second switch having first and second inputs and an output said first input being connected to said output of said second amplifier;

a third amplifier with an input and an output, whose gain factor is greater than that of said second amplifier;

a third switch having first and second inputs and an output, said first input being connected to said output of said third amplifier;

said inputs of said amplifiers being the first input of said means for automatically switching the range of measuring parameters of said impact impulse;

an operational amplifier having an input and an output which is the first output of said means for automatically switching the range of measuring parameters of said impact impulse, said input being connected to said outputs of the first, second and third switches, said output of said operational amplifier being connected to said first input of said comparator;

a zero-crossing detector having first and second inputs and an output, said first input being connected to said output of said operational amplifier, said second input, which is the third input of said means for automatically switching the range of measuring parameters of said impact impulse, being connected to said output of said reference voltage source;

a pulse former having an input and an output, said input being connected to said output of said zero-crossing detector;

a first AND element having a first input, a second input, which is the second input of said means for automatically switching the range of measuring parameters of said impact impulse, and an output, said first input being connected to said output of said pulse former, said second input being connected to said output of said high-frequency pulse generator;

a one-shot multivibrator having an input and an output which is the second output of said means for automatically switching the range of measuring parameters of said impact impulse, said input being connected to said output of said first AND element, said output being connected to said reset bus of said digital-analog converter;

a second AND element having first and second inputs and an output, said first input being connected to said output of the first AND element, said second input being connected to said output of said one-shot multivibrator;

a binary counter including a first and a second flip-flops, each having an input, first and second outputs, and a reset bus, the input of the first flip-flop being connected to said output of the second AND element, the input of the second flip-flop being connected to the first output of the first flip-flop and the first output being connected to said second input of the first switch;

a first NOT AND element having first and second inputs and an output, said first input being connected to the second output of the second flip-flop, said second input being connected to the second output of the first flip-flop, said output being connected to the second input of the third switch; and a second NOT AND element having first and second inputs and an output, said first input being connected to the first output of the first flip-flop, said second input being connected to the second output of the second flip-flop, said output being connected to the second input of the second switch.

3. The impact impulse measuring device according to claim 2, wherein each amplifier comprises a microcircuit operational amplifier provided with feedback means.

4. The impact impulse measuring device according to claim 2, wherein each switch includes a pair of transistors having common bases and common collectors, the emitter of one of the transistors being said first input and said output of said switch, and the common bases being said second input of said switch.

5. The impact impulse measuring device according to claim 2, wherein said operational amplifier includes a current-limiting resistor, one terminal of said current-limiting resistor being said input of said operational amplifier, an integrated microcircuit, a first input of said integrated microcircuit being connected to the other terminal of said current-limiting resistor, the output of said integrated microcircuit being said output of said operational amplifier, a bias resistor connected to a second input of said integrated microcircuit, and a feedback resistor connected to said first input of said integrated microcircuit and said output of said integrated microcircuits.

6. The impact measuring device according to claim 2, wherein said zero crossing detector includes a first current-limiting resistor, one terminal of said first current-limiting resistor being said first input of said zero crossing detector, a second current-limiting resistor, one terminal of said second current-limiting resistor being said second input of said zero crossing detector, and an integrated microcircuit, inputs of said integrated microcircuit being connected to other terminals of said first and said second current-limiting resistors, said output of said integrated microcircuit being said output of said zero crossing detector.

7. The impact impulse measuring device according to claim 2, wherein said pulse former includes a first input resistor, one terminal of said first input resistor being said input of said pulse former, a first transistor, the other terminal of said first input resistor being connected to a base of said first transistor, a first load resistor connected to a collector of said first transistor, a second input resistor, one terminal of said second input resistor being connected to said collector of said first transistor, a second transistor, another terminal of said second input resistor being connected to a base of said second transistor, a collector of said second transistor being said output of said pulse former, an emitter of said first transistor being connected to an emitter of said second transistor, and a second load resistor connected to said collector of said second transistor.

8. The impact impulse measuring device according to claim 2, wherein said multivibrator includes a first NOT AND element, an input of said first NOT AND element being said input of said multivibrator, a capacitor, one terminal of said capacitor being connected to an output of said first NOT AND gate, another terminal of said capacitor being said output of said multivibrator, a second NOT AND element, inputs of said second NOT AND element being connected to said another terminal of said capacitor, an output of said first NOT AND element being connected to another input of said first NOT AND element, and a resistor and a diode connected in parallel, said resistor and said diode being connected to said another terminal of said capacitor.

* * * * *